United States Patent [19]

Watari et al.

[11] 4,364,010

[45] Dec. 14, 1982

[54] SEMICONDUCTOR DEVICE WITH MONITOR PATTERN, AND A METHOD OF MONITORING DEVICE PARAMETERS

[75] Inventors: Kiyoto Watari, Kawasaki; Takeshi Fukuda, Tokyo, both of Japan

[73] Assignee: Fujitsu Limited, Kawasaki, Japan

[21] Appl. No.: 128,881

[22] Filed: Mar. 10, 1980

[30] Foreign Application Priority Data

Mar. 12, 1979 [JP] Japan ................................ 54-28558

[51] Int. Cl.$^3$ .................. G01R 31/26; B01J 17/00; H01L 29/72
[52] U.S. Cl. .................. 324/158 T; 29/574; 324/73 R; 357/34
[58] Field of Search ............ 324/73 R, 158 T, 158 R, 324/158 D; 357/34, 40; 29/574; 427/96

[56] References Cited

U.S. PATENT DOCUMENTS

| | | | |
|---|---|---|---|
| 3,815,025 | 6/1974 | Jordan | 324/73 R |
| 4,079,505 | 3/1978 | Hirano et al. | 29/574 |
| 4,176,258 | 11/1979 | Jackson | 324/73 R |

FOREIGN PATENT DOCUMENTS 2516396 10/1976 Fed. Rep. of Germany .

OTHER PUBLICATIONS

Patent Abstracts of Japan, vol. 2, No. 143, Nov. 25, 1978, Kokai No. 53-110476, p. 8982 E 78.
Patent Abstracts of Japan, vol. 2, No. 90, Jul. 22, 1978, Kokai No. 53-54482, p. 4142 E 78.
Magdo et al., "Dumbell Resistor . . . ", IBM Tech. Disc. Bull., vol. 15, No. 4, Sep. 1972, pp. 1330-1331.

Primary Examiner—Ernest F. Karlsen
Attorney, Agent, or Firm—Staas & Halsey

[57] ABSTRACT

A semiconductor device with a monitor pattern and a method for monitoring device parameters. The monitor pattern comprises a semiconductor layer, a first region, a second region and a third region. The first region is formed in the semiconductor layer. The second region is formed within the first region so that the surface of the first region is divided into two portions. The third region is formed in the semiconductor layer and electrically connected to the substrate. One of the two portions of the first region is electrically connected to the third region.

18 Claims, 9 Drawing Figures

SEMICONDUCTOR DEVICE WITH MONITOR PATTERN, AND A METHOD OF MONITORING DEVICE PARAMETERS

BACKGROUND OF THE INVENTION

The present invention relates to a semiconductor device, especially to one having a monitor pattern for a probing test of a sampled semiconductor wafer during a diffusion process.

In a process for forming a number of integrated circuit chips on a semiconductor wafer, a monitor pattern is formed on a corner of each IC chip. The monitor pattern is used for controlling the impurities percentage or the depth of the diffusion layer of the impurities by monitoring the transistor characteristic of the monitor pattern during the manufacturing process. In such a monitoring process, is called a probing test process, probes make contact with a collector region, base region and emitter region. The probing test process is a troublesome and time consuming process which must be done manually, because many chips are formed on a wafer and a fine adjustment is required for each of the sampled chips, which are located at various positions on the wafer, to compensate for characteristic changes, i.e., differences in characteristics, corresponding to the location of each such sampled chip on the wafer.

SUMMARY OF THE INVENTION

An object of the present invention is to provide a semiconductor device comprising a monitor pattern by means of which current gain, which is the most important characteristic of the transistor, can be easily and reliably measured.

Another object of the present invention is to provide a semiconductor device comprising a monitor pattern which makes it possible to achieve an automatic probing test.

A further object of the present invention is to provide a monitoring method for easily and reliably detecting the current gain of a semiconductor device.

In order to achieve the above objects, in the monitor pattern of a semiconductor device according to the present invention, pinch off resistance, which is the resistance of the base region located under the emitter region of the transistor, is measured. In the monitor pattern according to the present invention, the surface of the base region is divided into two portions by the emitter region. One portion is electrically connected with the wafer substrate. The pinch off resistance under the emitter region is detected by measuring the resistance between the substrate and the other portion of said divided base region.

Embodiments of the present invention will now be described and contrasted with the prior art with reference to the accompanying drawings.

DESCRIPTION OF THE PREFERRED EMBODIMENTS

Figure 1:
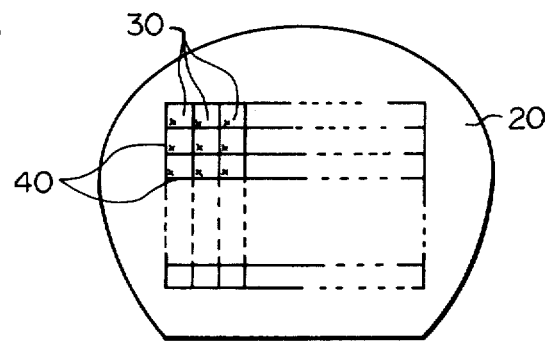
FIG. 1 is a plan view of a wafer.

A number of transistor chips 30 are formed on a wafer 20, as illustrated in FIG. 1. Each chip 30 is bounded by cutting lines 40, along which the chips are divided after transistors have been formed on the wafer. A monitor pattern is formed at the position marked X on each chip 30. The process for forming the monitor pattern corresponds to the process for forming the transistor on the wafer 20, and the monitor pattern is formed simultaneously with the transistor.

Figure 2:
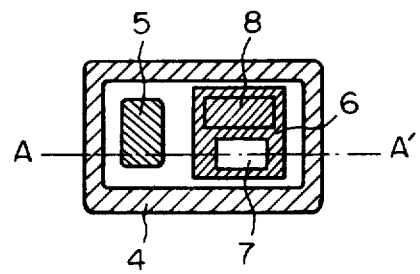
FIG. 2 is a plan view of a monitor pattern according to the prior art.
Figure 3:
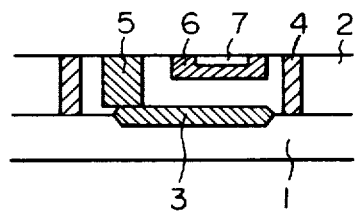
FIG. 3 is a sectional view taken along line A—A' of FIG. 2.

FIG. 2 and FIG. 3 illustrate an example of an earlier monitor pattern formed on each transistor chip. In the drawings, 1 designates a P type substrate, 2 designates an N type epitaxial layer, 3 designates an N type buried layer, 4 designates a P type isolation region, 5 designates an N type collector, 6 designates a P type base region, 7 designates an N type emitter region, and 8 designates a contact area of the P type base region. The isolation region 4 has a dimension of about 200 μm×150 μm. The emitter region 7 has a dimension of about 30 μm×40 μm. In the monitoring process, three probes make contact with the collector 5, emitter region 7, and base contact area 8, respectively. It is difficult to adjust the positions of the three probes on such a small area, and therefore a great amount of time is required. Besides, the diameter of the probes must be very small so as to avoid contact with each other. Therefore, the probes are very weak and contact pressure must be weak. Accordingly, the result of the measurement is not reliable because it is affected by the contact surface condition of the transistor chip. It is known that the measured value of current gain ($h_{FE}$), which is the most important characteristic of the transistor, is usually smaller than the final current gain value of the transistor chip.

The pinch off resistance ($R_p$), i.e. the resistance of the base region under the emitter region, is defined relative to the current gain ($h_{FE}$) as follows:

$$\frac{1}{h_{FE}} \simeq \frac{\int N_B dx \cdot D_{PE}}{D_{NB} \cdot N_{DE} \cdot W_E}$$

$$\frac{1}{R_p} \simeq q \cdot \mu_p \cdot \int N_B dx$$

$\int N_B dx$; Gummel Number
$D_{PE}$; Diffusion coefficient of holes in emitter region
$D_{NB}$; Diffusion coefficient of electrons in base region
$N_{DE}$; Impurities density
$W_E$; Depth of emitter region
q; electric charge of electron
$\mu_p$; mobility of holes in base In accordance with the above formulae, the current gain ($h_{FE}$) can be detected by measuring the pinch off resistance ($R_p$).

Figure 4:
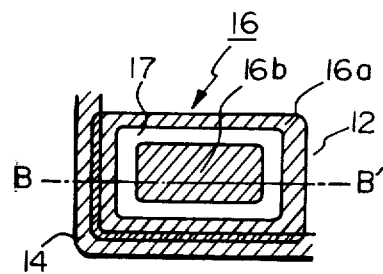
FIG. 4 is a plan view of a monitor pattern according to the present invention.
Figure 5:
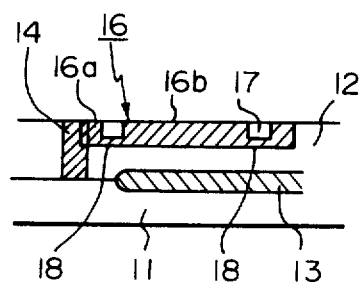
FIG. 5 is a sectional view taken along line B—B' of FIG. 4.

FIG. 4 and FIG. 5 illustrate an example of the monitor pattern formed on each transistor chip according to the present invention. The illustrated pattern is formed as follows. An N type buried layer 13 is formed on a P type substrate 11 by a diffusion process. After that, an N type epitaxial layer 12 is formed on the substrate 11. Then, a P type isolation region 14 is formed. Then, a P type base region 16 is formed in partial overlap with the isolation region 14. Then, a ring shaped N type emitter region 17 is formed near the periphery of the base region 16. Each of the above mentioned parts of the monitor pattern is formed simultaneously with the transistor by a photo-lithography process and a diffusion process which are separately known. The ring shaped emitter region 17 formed on the base region 16 divides the surface of the base region 16 into two portions, a peripheral portion 16a and a core portion 16b. The resistance of the portion 18 of the base region located under the emitter region 17, which resistance varies in inverse proportion with the thickness of the portion 18, is measured by applying a voltage of several volts between the substrate 11 and the core portion 16b of the base region 16 so as to generate an electric current. The resistance to direct current of the base region portion 18 under the emitter region is called pinch off resistance. The value of the pinch off resistance normally ranges from several K$\Omega$ through several tens of K$\Omega$. The value is in proportion to the current gain, which is the most important characteristic of the transistor. Therefore, for example, if the pinch off resistance is high, a transistor of high current gain is produced. During the manufacturing process of the transistor, diffusion control can be achieved by monitoring the pinch off resistance as an index of the current gain of the transistor to be produced.

The above mentioned monitor pattern has a relatively large area of the core portion 16b in the base region 16, so that a thick and strong probe, e.g. one made of tungsten wire, can be used. Such a probe can be applied to the core portion 16b with a high contact pressure. The measured current gain ($h_{FE}$) accords with the actual current gain of the transistor to be produced, because the surface condition of the transistor does not affect the value of the pinch off resistance. Therefore, proper diffusion control can be achieved during the manufacturing process, so that the reliability of the products increases. The monitoring test is achieved by using only one probe. Therefore, the measurement can be easily achieved in a short amount of time. It is also possible to achieve an automatic monitoring test.

As illustrated in FIG. 1, each transistor chip 30 on the wafer 20 is defined by the cutting lines 40. Along these cutting lines 40, isolation regions of the same conductivity as the wafer substrate are formed. It is possible to use this isolation region along the cutting line as the above-mentioned isolation region 14 of the monitor pattern of FIG. 4.

Figure 6:
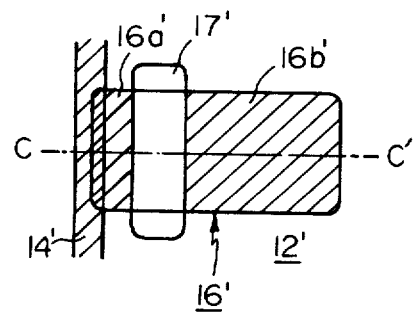
FIG. 6 is a plan view of another monitor pattern according to the present invention.
Figure 7:
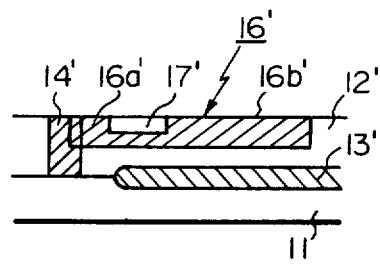
FIG. 7 is a sectional view taken along line C—C' of FIG. 6.

FIG. 6 and FIG. 7 illustrate another example of the monitor pattern according to the present invention. In this embodiment, the surface of the base region 16' is divided into two portions, a left portion 16a' and a right portion 16b'. A part of the left portion 16a' overlaps with the isolation region 14' which communicates with the wafer substrate 11' (FIG. 7). The resistance of the base region 18' positioned under the emitter region 17' can be detected by measuring the current due to a voltage which is applied between the wafer substrate 11' and the right portion 16b' of the base region 16'.

Figure 8:
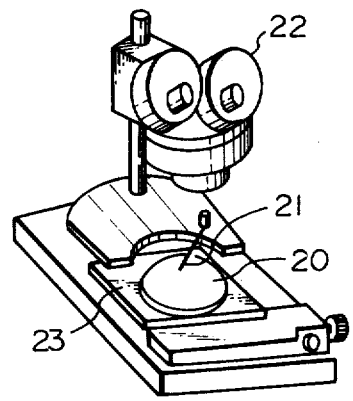
FIG. 8 is a perspective view of a monitoring device for a monitor pattern according to the present invention.
Figure 9:
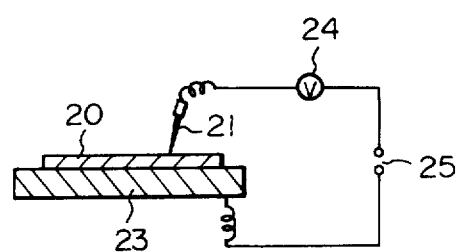
FIG. 9 is a circuit diagram of the monitoring device according to the present invention.

An example of a manually operated probing test device is illustrated in FIG. 8. 20 designates a semiconductor wafer, 21 designates a probe, and 22 designates a microscope of about 400 magnifications. The wafer 20 is placed on a stage 23. The probe 21 is placed in contact with the base region 16 of the monitor pattern of the wafer 20, at the portion designated by 16b in FIG. 4 or FIG. 6. As illustrated in FIG. 9, a voltage is applied between the probe 21 and the stage 23 by a power source 24 and the electric current is measured by a galvanometer (not shown) connected to a terminal portion 25 so as to detect the pinch off resistance of the monitor pattern.

As mentioned above, in the semiconductor device comprising a monitor pattern according to the present invention, the monitoring test can be easily and reliably achieved since only one probe is used in the measurement. Besides, the monitor pattern area can be decreased so that the chip surface area can be effectively used for forming an IC pattern. It is possible to achieve an automatic monitoring test.

In the present invention, since the base region is overlapped with the isolation region, the invention has another advantage in that, by monitoring the monitor pattern, it is possible to check whether the isolation region is completely formed.

According to the present invention, the probing test process can be simplified, and the detected current gain ($h_{FE}$) accurately corresponds to the actual current gain of the IC element.

The present invention has been described with regard to the NPN type bi-polar transistor. However, it is apparent that the present invention can also be applied to a PNP type integrated circuit.

We claim:

1. A semiconductor device comprising a chip having at least one semiconductor circuit element formed thereon in a first area of the chip and a monitor pattern formed simultaneously with said circuit element in a predetermined, second area of the chip, said semiconductor device comprising:
   a substrate and a semiconductor layer of a first conductivity type formed on said substrate; and
   said monitor pattern comprising:
   a first region of a second conductivity type formed in said semiconductor layer;
   a second region of the first conductivity type formed in said first region in such position that the surface of said first region is divided into two portions by said second region; and
   a third region of the second conductivity type formed in said semiconductor layer and electrically connected to said substrate and to one of said two portions of said first region, at least a part of the surface of the other of said first region being exposed to enable electrical contact thereto.

2. A monitoring method for use in a process for producing a semiconductor device comprising a chip having at least one semiconductor circuit element and a monitor pattern thereon, comprising the steps of:
   forming said monitor pattern in a predetermined area of the chip simultaneously with the formation of said at least one circuit element in the remaining area of the chip, said monitor pattern comprising:
   a semiconductor layer of a first conductivity type formed on a substrate;
   a first region of a second conductivity type formed in said semiconductor layer;
   a second region of the first conductivity type formed in said first region, said first region being superficially divided into first and second portions by said second region; and a third region of the second conductivity type formed in said semiconductor layer and electrically connected to said substrate and to said first portion of said first region, at least a part of the surface of said second portion of said first region being exposed to enable electrical contact thereto;

and said method further comprising the steps of:

applying a voltage between said second portion of said first region at said exposed, electrical contact surface thereof and said substrate; and measuring the pinch off resistance of said monitor pattern as an index of the current gain of the semiconductor device.

3. A method for producing a plurality of semiconductor devices in a wafer delineated to define a plurality of corresponding chips, each said chip comprising a semiconductor layer of a first conductivity type formed on a substrate of a second conductivity type, said layer and said substrate being common to said chips of said wafer, and at least certain of said chips comprise at least one semiconductor circuit element and a monitor pattern, comprising the steps of:

defining a predetermined area of each of said certain chips for having formed therein a monitor pattern for that chip simultaneously with the formation of said at least one semiconductor circuit element on the remaining area of said chip;

forming a first region of a second conductivity type in said semiconductor layer of each said chip, forming a second region of the first conductivity type in said first region, said second region dividing said first region into first and second portions, forming a third region of the second conductivity type in said semiconductor layer, extending to and electrically connected with said substrate and overlapping and being electrically connected to one of said first and second portions of said second region, at least a part of the surface of the other of said two portions of said first region being exposed to afford electrical contact thereto, applying a voltage to at least selected said chips of said wafer, during a diffusion process for forming said second region of said monitor pattern in said chips, between the other said portion of said first region at said exposed, electrical contact surface thereof and said substrate of each said selected chip to produce an electrical current flow therethrough, and determining the resistance to the flow of current for deriving a value of the pinch off resistance of said monitor pattern in each of said selected chips.

4. A wafer comprising:

a plurality of chips, each said chip comprising a monitor pattern formed in one corner thereof and at least one semiconductor circuit element;

a plurality of cutting lines formed in said wafer between adjacent ones of said chips; and each said monitor pattern comprises a substrate, a semiconductor layer of a first conductivity type formed on said substrate, a first region of a second conductivity type formed in said semiconductor layer, a second region of said first conductivity type formed in said first region in such position that the surface of said first region is divided into two portions by said second region, and a third region of said second conductivity type formed in said semiconductor layer and electrically connected to said substrate and to one of said two portions of said first region, at least a part of the surface of the other portion of said first region being exposed to enable electrical contact thereto.

5. A semiconductor device according to claim 1, in which said second region has a ring shape configuration and divides the surface of said first region into a core portion and a peripheral portion.

6. A semiconductor device according to claim 1, in which said second region crosses said first region so as to divide the surface of said first region into said two portions.

7. The device of claims 1, 5, 6, 2 or 3, wherein said first conductivity type is p-type and said second conductivity type is n-type.

8. The device of claims 1, 5, 6, 2 or 3, wherein said first conductivity type is n-type and said second conductivity type is p-type.

9. The device of claim 1, 2, or 3, wherein said monitor pattern is formed in one corner of the semiconductor device.

10. The wafer of claim 4 wherein a small region surrounding each of said cutting lines is of said second conductivity type and partly overlaps said first region of respective ones of said monitoring patterns which are adjacent to said cutting line.

11. The wafer of claim 4 or 10, wherein said first region of each said monitoring pattern is substantially smaller than 150 by 200 microns.

12. The method of claims 2 or 3, wherein said step of applying a voltage comprises contacting said second portion of said monitor pattern at said exposed, electrical contact surface thereof with a probe.

13. The method of claim 12, wherein said probe comprising a tungsten wire.

14. The method of claim 13, wherein said probe contacting step is performed automatically.

15. The method of claim 13, further comprising the step of positioning said wafer atop a platform, and wherein said step of applying a voltage comprises supplying said voltage to and between said probe and said platform.

16. The method of claim 15, wherein said platform is positioned under a microscope.

17. The method of claim 13, wherein said probe contacts said second portion of said monitor pattern at said exposed, electrical contact surface thereof with a relatively large pressure.

18. The wafer of claim 10, wherein said small region comprises said third region.

* * * * *